United States Patent
Ouderkirk et al.

(10) Patent No.: US 11,067,850 B2
(45) Date of Patent: Jul. 20, 2021

(54) MULTI-MODE DISPLAY

(71) Applicant: 3M INNOVATIVE PROPERTIES COMPANY, St. Paul, MN (US)

(72) Inventors: Andrew J. Ouderkirk, Kirkland, WA (US); Timothy L. Wong, St. Paul, MN (US); Erin A. McDowell, Afton, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 7 days.

(21) Appl. No.: 15/763,139

(22) PCT Filed: Oct. 3, 2016

(86) PCT No.: PCT/US2016/055119
§ 371 (c)(1),
(2) Date: Mar. 26, 2018

(87) PCT Pub. No.: WO2017/066020
PCT Pub. Date: Apr. 20, 2017

(65) Prior Publication Data
US 2018/0275460 A1    Sep. 27, 2018

Related U.S. Application Data

(60) Provisional application No. 62/240,303, filed on Oct. 12, 2015.

(51) Int. Cl.
*G02F 1/1335* (2006.01)
*H01L 27/32* (2006.01)
(Continued)

(52) U.S. Cl.
CPC ..... *G02F 1/133555* (2013.01); *G02B 26/005* (2013.01); *G02B 27/141* (2013.01);
(Continued)

(58) Field of Classification Search
None
See application file for complete search history.

(56) References Cited

U.S. PATENT DOCUMENTS 4,196,973 A * 4/1980 Hochstrate ........ G02F 1/133555
349/114
7,292,614 B2    11/2007 Cok et al.
(Continued)

FOREIGN PATENT DOCUMENTS

CN    203149248    8/2013
CN    104020602    9/2014
(Continued)

OTHER PUBLICATIONS

JP2004012571 Machine Translation (Year: 2004).*
(Continued)

*Primary Examiner* — James A Dudek
(74) *Attorney, Agent, or Firm* — Jonathan L. Tolstedt

(57) ABSTRACT

Multi-mode displays are described. In particular, multi-mode displays having an emissive display element, a partial reflector disposed on the emissive display element, a spatial light modulator disposed on the partial reflector, and an absorbing polarizer disposed on the spatial light modulator are described. Multi-mode displays having at least reflective display modes and emissive display modes are described. The display is configured such that switching between these modes happens quickly or even automatically.

11 Claims, 3 Drawing Sheets

(51) Int. Cl.
*G02B 26/00* (2006.01)
*G02B 27/14* (2006.01)
*G02B 27/28* (2006.01)
*G02F 1/153* (2006.01)

(52) U.S. Cl.
CPC ......... *G02B 27/142* (2013.01); *G02B 27/286* (2013.01); *G02F 1/133528* (2013.01); *G02F 1/133553* (2013.01); *G02F 1/153* (2013.01); *H01L 27/3232* (2013.01); *G02F 1/133557* (2021.01); *G02F 2201/44* (2013.01)

(56) References Cited

U.S. PATENT DOCUMENTS

| | | | |
|---|---|---|---|
| 7,965,355 | B2 | 6/2011 | Park et al. |
| 9,057,824 | B2 | 6/2015 | Gollier et al. |
| 2002/0030776 | A1* | 3/2002 | Khan ................ G02F 1/133528 349/114 |
| 2004/0164292 | A1 | 8/2004 | Tung et al. |
| 2008/0030656 | A1 | 2/2008 | Watson et al. |
| 2010/0020265 | A1* | 1/2010 | Senoue ................ G09G 3/3426 349/62 |
| 2011/0050545 | A1 | 3/2011 | Namm et al. |
| 2011/0050755 | A1 | 3/2011 | Amron et al. |
| 2012/0229727 | A1 | 9/2012 | Murata et al. |
| 2012/0300307 | A1 | 11/2012 | Borrelli et al. |
| 2013/0187962 | A1 | 7/2013 | Vieri et al. |
| 2014/0158997 | A1 | 6/2014 | Ahn et al. |
| 2015/0029748 | A1 | 1/2015 | Yokota et al. |
| 2015/0146051 | A1 | 5/2015 | Abe et al. |
| 2015/0155340 | A1 | 6/2015 | Lim et al. |
| 2017/0307914 | A1* | 10/2017 | Zhong ................ G02F 1/13306 |

FOREIGN PATENT DOCUMENTS

| | | |
|---|---|---|
| JP | 59107380 | 6/1984 |
| JP | 59136601 | 9/1984 |
| JP | H10-339859 | 12/1998 |
| JP | H11-160704 | 6/1999 |
| JP | 2004-012571 | 1/2004 |
| JP | 2007-127724 | 5/2007 |
| JP | 2014-026058 | 2/2014 |
| WO | WO 2011-011377 | 1/2011 |
| WO | WO 2011-078988 | 6/2011 |
| WO | WO 2012/004922 | 1/2012 |

OTHER PUBLICATIONS

PCT International Search Report from PCT/US2016/055119, dated Mar. 21, 2017, 7 pages.

Yang, Bo-Ru et al., "Emiflective Display with Integration of Reflective Liquid Crystal Display and Organic Light Emitting Diode", Japanese Journal of Applied Physics, Japan Society of Applied Physics, vol. 46, No. 1, Jan. 1, 2007, pp. 182-186.

* cited by examiner

//MULTI-MODE DISPLAY

BACKGROUND

Multi-mode displays have two or more methods of displaying information. Certain modes may be more suitable than others depending on ambient conditions, mode of use, and user preferences.

SUMMARY

In one aspect, the present disclosure relates to a multi-mode display. The multi-mode display includes an emissive display element, a partial reflector disposed on the emissive display element, a spatial light modulator disposed on the partial reflector, and an absorbing polarizer disposed on the liquid crystal module.

In another aspect, the present disclosure relates to a multi-mode display including a backlight. The backlight includes a first liquid crystal module and at least one absorbing polarizer. The multi-mode display further includes a partial reflector disposed on the backlight, a second liquid crystal module disposed on the partial reflector, and an absorbing polarizer disposed on the second liquid crystal module.

In yet another aspect, the present disclosure relates to a multi-mode display including an emissive display element patterned on a reflector, a liquid crystal module disposed on the emissive display element, and an absorbing polarizer disposed on the liquid crystal module.

In another aspect, the present disclosure relates to a multi-mode display. The multi-mode display includes a reflector, a partially transparent emissive display element disposed on the reflector, a liquid crystal module disposed on the partially transparent emissive display element, and an absorbing polarizer disposed on the liquid crystal module.

In yet another aspect, the present disclosure relates to a multi-mode display. The multi-mode display includes an emissive display. The multi-mode display also includes a reflective display having a reflector. The emissive display backlights the reflective display, and the reflector of the reflector of the reflective display is partially transmissive.

DETAILED DESCRIPTION

Multi-mode displays have more than one viewing mode. For example, a multi-mode display may have an outdoor viewing mode and an indoor viewing mode. As another possibility, a multi-mode display may have a high brightness and a low brightness mode (such as to save battery or power). Multi-mode displays described herein may have aspects or elements of two different types of displays. For example, a multi-mode display may have reflective display elements and transmissive elements. Or, alternatively, a multi-mode display may have reflective display elements and emissive display elements.

Such multi-mode displays may be useful in display devices that are subject to changing ambient conditions or use modes. For example, a traditional backlit or emissive display must be very bright and consume a lot of power in order to be seen in bright ambient conditions, such as outside on a sunny day. Despite this power expenditure, the maximum luminance of the display may still be difficult to read in such a high illuminance environment. Likewise, traditional reflective displays are difficult to read in low ambient light conditions, because they rely primarily on environmental illuminance. Thus, additional or supplemental backlighting or frontlighting may be necessary to make the display readable. Further, most reflective displays operate in grayscale features or with a relatively low color gamut or contrast.

For wearable displays, it may be desirable or expected for such a display to provide on demand information; in other words, it may be desirable for such a display to be always on. Especially for wearable displays that simulate non-active display accessories, such as watches, it may appear strange or distracting to others to see a blank or dark display when the wearer is not actively viewing the display. Most of these selectively powered displays do so because the power consumption is unacceptably high for such devices with such batteries. Again, for the case of watches, an aesthetically desirable compact and thin form factor physically reduces the size and accordingly available power to be consumed. Hybrid or multi-mode devices described herein may be able to address some of these concerns.

Figure 1:
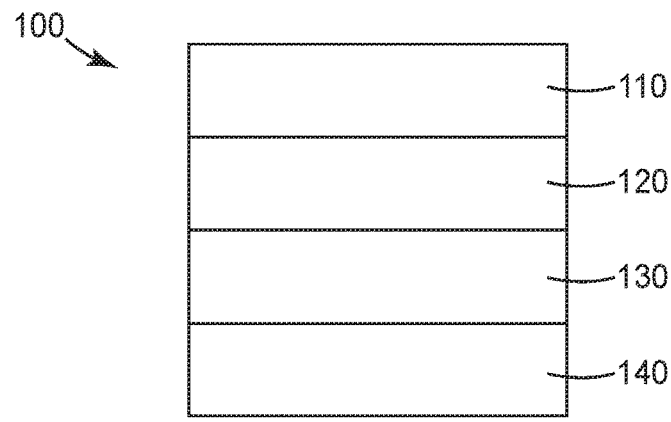
FIG. 1 is an elevation cross-section of a display.

FIG. 1 is an elevation cross-section of a display. Display 100 includes absorbing polarizer 110, spatial light modulator 120, partial reflector 130, and emissive display element 140.

Absorbing polarizer 110 may be any suitable material and made through any suitable process. For example, absorbing polarizer 110 may be a linear absorbing polarizer. Linear absorbing polarizers may be formed, for example, from a polyvinyl alcohol carrier web stained with iodine or otherwise dichroic polarization absorbing dyes and subsequently oriented. One or more cellulose triacetate layers (also known as TAC) may be used to protect the stained layer.

Absorbing polarizer 110 may be a linear type absorbing polarizer or it may be a circular or elliptical type absorbing polarizer. A circular or elliptical absorbing polarizer may be formed by the combination of a quarter or near-quarter wave plate (for elliptical polarizers) and a linear absorbing polarizer. The wave plate converts incident light, for example, from a circular polarization to a linear polarization, which then may be absorbed or passed by the absorbing linear polarizer. Such a wave plate may be designed to be centered around a wavelength of interest or a wavelength range of interest or it may be designed to have a wavelength-dependent polarization rotation (e.g., it may be an achromatic polarization rotator). As absorbing polarizer 110 may be in some embodiments the external surface of display 100, absorbing polarizer 110 may include a coating or additional matte layer in order to provide an anti-glare effect. In some instances a textured or structured surface may also provide a more satisfying tactile sensation or experience for a viewer (particularly if the display is touch sensitive). Absorbing polarizer 110 may have any suitable bulk three dimensional shape, including thickness.

In some embodiments, absorbing polarizer 110 may be or include an absorbing-reflecting polarizer. Reflecting polarizers—in particular multilayer reflective polarizers such as DBEF or APF (available from 3M Company, St Paul, Minn.)—preferentially reflect light of one polarization while preferentially transmitting light of a second, orthogonal polarization. The reflectivity is provided by interfaces between many (e.g., tens, hundreds, or more) birefringent repeat units (AB-AB-AB, etc. where, as an example, A may be a high-index birefringent material and B may be a low-index isotropic material), whose alternating materials are carefully selected and processed in order to provide desired reflectivity over a desired range of wavelengths. Reflectivity is provided by constructive interference of light incident on these layer pairs. Absorbing-reflecting polarizers are formed by introducing polarization absorbing elements into some or all of the layers of a reflecting polarizer. In some embodiments, the polarization absorbing elements (such as dyes) may be in all of the A layers, all of the B layers, some of either, both, or neither, instead being in one or more skin or protective boundary layers between packets.

Spatial light modulator 120 may be any suitable layer or series of layers capable of manipulating or affecting light differently depending on the relevant light's location on display 100. In some embodiments spatial light modulator 120 is an electrically driven polarization rotator or modulator. In some embodiments, where spatial light modulator 120 is a polarization rotator or modulator, its combination with an absorbing polarizer may enable the spatial light modulator to selectively and spatially control the transmission of light through the absorbing polarizer. In some embodiments, spatial light modulator 120 is a liquid crystal layer. As a liquid crystal layer, spatial light modulator 120 may include suitable electronics and driving layers, such as one or more layers of ITO (indium tin oxide or another transparent conductor) and appropriate addressable electronics such that the spatial light modulator 120 may have a one or a plurality of pixels. In some embodiments, spatial light modulator 120 includes a color filter or color filter array. In some embodiments, spatial light modulator 120 includes an electrophoretic layer or layers, an electrochromic layer or layers, or an electrowetting layer or layers. As with the liquid crystal layer, appropriate electronics and conductive layers and/or traces may be provided in order to enable the operation of the spatial light modulator. As used herein, the term liquid crystal module, unless indicated otherwise, should be understood to not include one or more attached absorbing polarizers, as is sometimes used in the field. Absorbing polarizer 110 is disposed (either free floating or laminated) on spatial light modulator 120.

Partial reflector 130 is any suitable partial reflector and at least partially reflects light. In this sense, partial reflector refers to a material that reflects more than that simply due to Fresnel interface reflection. For example, a partial reflector 130 may reflect more than 10% of incident light, 20% of incident light, 30% of incident light, 40% of incident light, or 50% of incident light. However, partial reflector 130 should also have sufficient transmission; i.e., it should not be a full reflector. For example, a partial reflector 130 may reflect less than 90% of incident light, less than 80% of incident light, less than 70% of incident light, less than 60% of incident light, or less than 50% of incident light. In some embodiments, it is not the material specifically that reflects and transmits light, but rather its spatial configuration. For example, a perforated reflector may be suitable for use a partial reflector 130 in display 100 even though certain portions may have very high reflectivity and certain portions may have very high transmissivity.

The partial reflector may be a partial mirror. The partial reflector may have a spatially varying reflectivity. The partial reflector may be a perforated reflector. In some embodiments, the partial reflector is a dichroic color filter, which may be an absorbing filter or a reflecting filter. In some embodiments, the partial reflector reflects by total internal reflection. For example, the partial reflector may be a microstructured prism film that reflects light off its prism-air interfaces. The prisms can be any suitable shape, size, and pitch, and may vary in one or more of those parameters along one or more directions of the partial reflector. In some embodiments, the partial reflector may be a multilayer optical film. In some embodiments, the partial reflector may include or be a diffuser (either bulk or surface type). The diffuser may be primarily a forward-scatterer, or, in other words, it may have a low portion of light scattered backwards from the diffuser (e.g., less than 10% or less than 5%). In some embodiments, such a diffuser may be a roughened partial reflector. In some embodiments, the diffuser may be a polarization preserving diffuser. In some embodiments, the diffuser may include one or more features to reduce sparkle in the display. For example, the diffuser may include graded-index particles or beads, a diffractive grating along one or more directions, or a combination of the two features.

Emissive display element 140 may be any suitable emissive display element. In some embodiments, emissive display element 140 may be an array of standard LEDs. In some embodiments, emissive display element 140 can include organic light emitting diodes (OLEDs). Emissive display element 140 may be monochromatic or it may include multiple color elements or subpixels. Emissive displays typically refer to displays that directly provide an image, in contrast with liquid crystal display type devices, which are illuminated by a uniform backlight and form an image through spatial light modulation or light gating. Emissive display element 140 may include extraction features on the OLED elements, including certain extraction features that minimize the appearance of sparkle. Emissive display element 140 also includes any necessary or suitable electronics and driving electronics in order to operate as desired.

Display 100 may be capable of operating in multiple display modes. For example, in a first mode, display 100 operates primarily as a reflective display. To provide maximum reflection (i.e., a light spot), the spatial light modulator is configured such that light is not rotated or modulated after passing through the absorbing polarizer. A portion of light is reflected by the partial reflector and maintains (or substantially maintains) its polarization state, which is necessarily still the pass state of the absorbing polarizer. To provide minimum reflection (i.e., a dark spot), the spatial light modulator is configured so that light is rotated after passing through the absorbing polarizer. For example, the spatial light modulator might rotate light from linear polarized light to right handed circularly polarized light. The circularly polarized light reverses its handedness to left handed upon reflection off the partial reflector (near normal incidence) and is converted back into linear polarized light (albeit of an orthogonal polarization state) by the spatial light modulator. This light will be primarily polarized as the block state of the polarizer, and will be mostly absorbed. As an alternative example, the absorbing polarizer could be a circular absorbing polarizer, for which the spatial light modulator may or may not rotate. These considerations are within the design capabilities of the skilled person and as long as they are configured to be operational should not be understood as limited by the exemplary descriptions herein.

In another mode, display 100 operates primarily as an emissive display. Light from emissive display element 140 is at least partially transmitted through partial reflector 130. That fraction of light may or may not be modulated by spatial light modulator 120, but remains unpolarized. Approximately half of the light is then absorbed by absorbing polarizer 110 and the remaining light exits the display.

There may be other modes available or desirable in such a display, including modes where the display operates both as a reflective display and an emissive display. The configuration of display 100 is such that switching among these modes can be done quickly and even automatically (such as with an ambient light level sensor).

Figure 2:
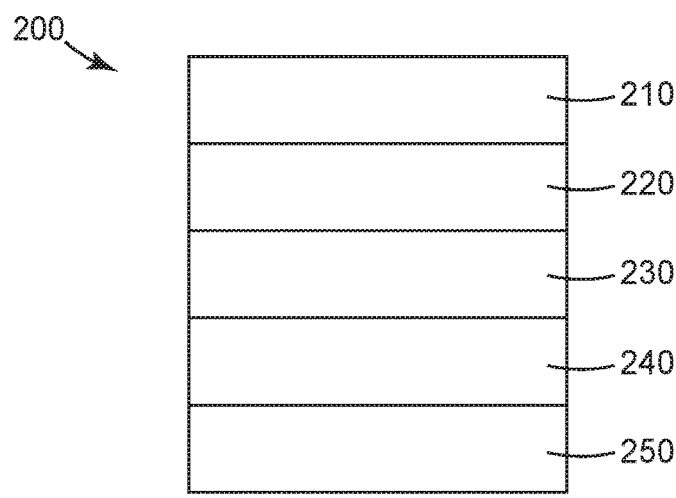
FIG. 2 is an elevation cross-section of another display.

FIG. 2 is an elevation cross-section of another display. Display 200 includes first absorbing polarizer 210, spatial light modulator 220, partial reflector 230, second absorbing polarizer 240, and emissive display element 250. Display 200 is similar to and largely corresponds to display 100 in FIG. 1; however, display 200 includes both a first absorbing polarizer 210 and second absorbing polarizer 240.

First absorbing polarizer 210 and second absorbing polarizer 240 may be the same or similar in construction and orientation or they may be different. In some embodiments one or both of first absorbing polarizer 210 and second absorbing polarizer 240 may be a linear or circular (or elliptical) absorbing polarizer. The absorbing polarizers could be arranged parallel, orthogonally, or in some other orientation.

The operation of display 200 may be similar to display 100 in FIG. 1. Importantly, however, the light from the emissive passing through the second absorbing polarizer is polarized in contrast to the emissive display element in display 100. Therefore, the first spatial light modulator and the first absorbing polarizer should be configured in this mode such that at least some light is, whether modulated or not modulated by the first spatial light modulator, able to pass through the first absorbing polarizer.

Figure 3:
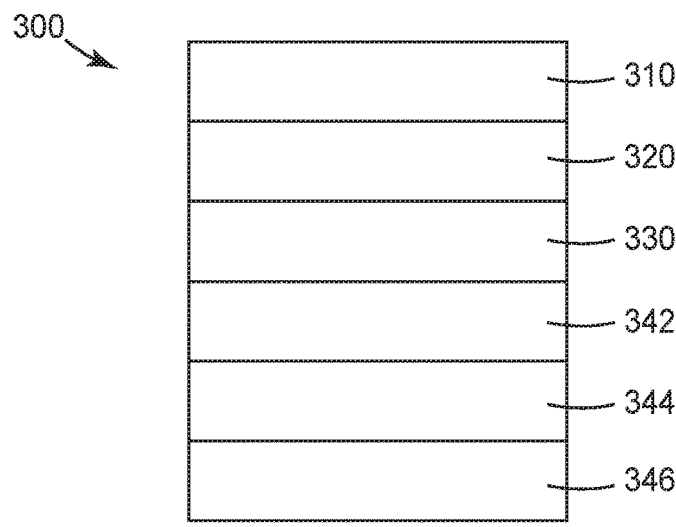
FIG. 3 is an elevation cross-section of another display.

FIG. 3 is an elevation cross-section of another display. Display 300 includes first absorbing polarizer 310, first spatial light modulator 320, partial reflector 330, second absorbing polarizer 342, second spatial light modulator 344, and backlight 346. Display 300 is similar to display 200 and display 100 of FIGS. 1 and 2. Display 300 includes a second absorbing polarizer, a second spatial light modulator, and a backlight in place of, for example, emissive display element 140 of FIG. 1.

The first and second spatial light modulators may be the same or they may be different. They may include different arrangements of pixels or subpixels or may or may not have color filters or color filter arrays. First spatial light modulator 320 may be similar to spatial light modulator 120 described in conjunction with FIG. 1. As first spatial light modulator 320 is primarily responsible for creating or managing the reflective display mode image, first spatial light modulator 320 may be any suitable spatial light modulator.

Second spatial light modulator 344, along with second absorbing polarizer 342 and backlight 346, essentially form a backlit display unit. In some embodiments, second spatial light modulator is a liquid crystal module. Second absorbing polarizer 342 may be any suitable absorbing polarizer, and may be the same or different as first absorbing polarizer 310, each having some or all of the features described in conjunction with absorbing polarizer 110 in FIG. 1.

The general operation of display 300 is similar to that as described for display 100 in FIG. 1. In a first mode, the first spatial light modulator is configured to either modulate light such that it is ultimately passed or absorbed by first absorbing polarizer 310, resulting in the appearance generally of dark portions and light portions. As an alternative mode of operation, for example a backlit mode, the backlight and second spatial modulator 344 may operate to form a backlit image. Importantly, the light from the backlight passing through the second absorbing polarizer is polarized in contrast to the emissive display element in display 100. Therefore, the first spatial light modulator and the first absorbing polarizer should be configured in this mode such that at least some light is, whether modulated or not modulated by the first spatial light modulator, able to pass through the first absorbing polarizer.

Figure 4A:
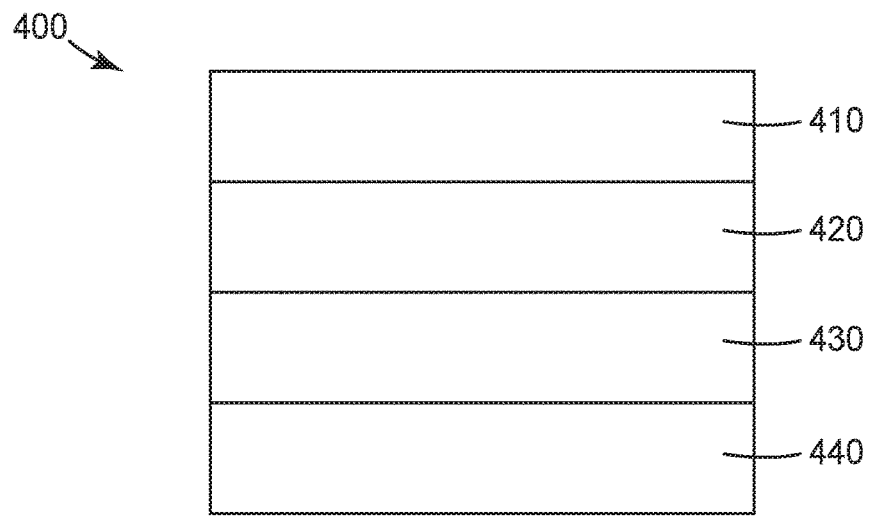
FIG. 4A is an elevation cross-section of another display.

FIG. 4A is an elevation cross-section of another display. Display 400 includes absorbing polarizer 410, spatial light modulator 420, emissive display element 430, and reflector 440.

Figure 4B:
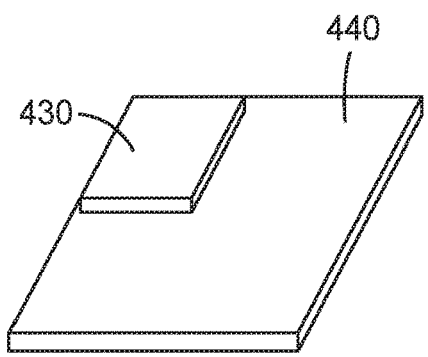
FIG. 4B is a top perspective view of a portion of one configuration of the display of FIG. 4A.
Figure 4D:
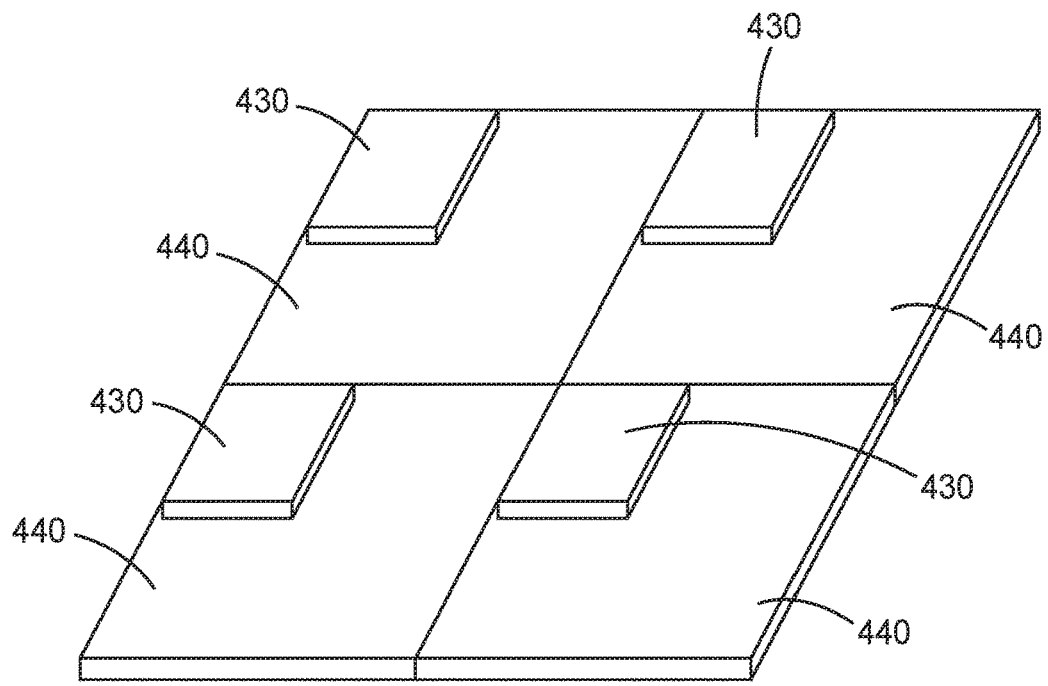
FIG. 4D is a top perspective view of a portion of another configuration of the display of FIG. 4A.
Figure 5:
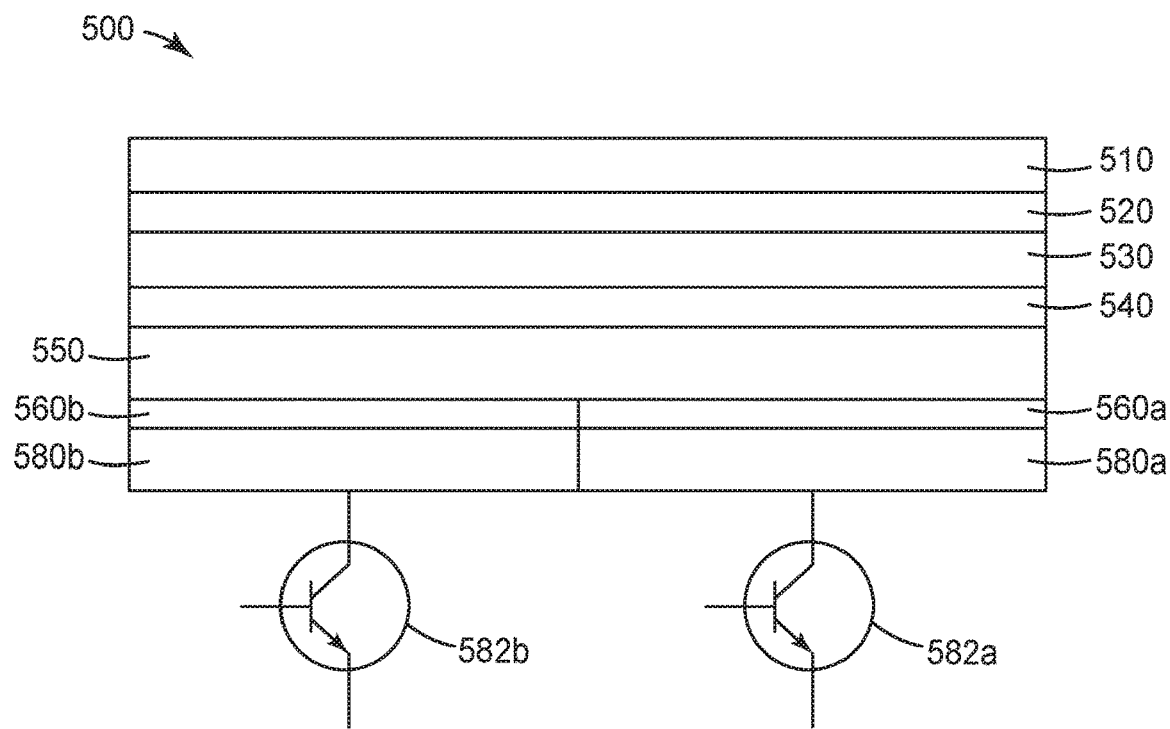
FIG. 5 is a schematic elevation cross-section of another display.

Emissive display element 430 is disposed on reflector 440. In some embodiments, emissive display element 430 is at least partially transmissive such that reflector 440 can reflect light when display 400 is operating primarily as a reflective display. In this case, emissive display element 430 should not substantially depolarize light. This general configuration is shown in FIG. 4B. In some embodiments, emissive display element 430 may be selectively patterned on reflector 440, so regardless of the transmissivity of the emissive display element, a substantial portion of the area of the display is unpatterned reflector. In some embodiments, between 40% and 60% may be unpatterned reflector, between 60% and 75% may be unpatterned reflector, between 70% and 80% may be unpatterned reflector, between 75% and 90% may be unpatterned reflector, or between 80% and 95% may be unpatterned reflector. This general configuration is shown in FIGS. 4B and 4D. In some embodiments, the emissive display element is patterned alongside the reflector; i.e., the two components are in the same plane. This general configuration is shown in FIG. 5.

Reflector 440 may be any suitable reflector, including multilayer optical films (such as Enhanced Specular Reflector (ESR), available from 3M Company, St. Paul, Minn.), metalized films, polished or roughened metals, or vapor deposited films. Reflector 440 may have any suitable degree of specularity and may or may not have some degree of diffusiveness. Reflector 440 may have greater than 90% reflectivity, greater than 95% reflectivity, or greater than 97% reflectivity. Reflector 440 may also have a spatially varying (periodic, non-periodic, or gradient) reflectivity or specularity.

The operation of display 400 in FIG. 4 is similar to those of other displays described herein. In a first mode of operation the absorbing polarizer either transmits or absorbs light reflected off reflector 440, depending on the state of spatial light modulator 420. Similarly, emissive display element 430 emits light that is at least partially transmitted through absorbing polarizer 410 in another mode of operation. Both the emissive display element and the reflective display portion of the display may contribute at the same time to forming an image.

FIG. 4B is a top perspective view of a portion of one configuration of the display of FIG. 4A. Emissive display element 430 is disposed on reflector 440. Reflector 440 may have one area where emissive display element 430 is disposed or patterned. Emissive display element 430 may be at least partially transmissive. In some embodiments, emissive display element 430 may have a spatially varying (periodic, non-periodic, or gradient) transmissivity.

Figure 4C:
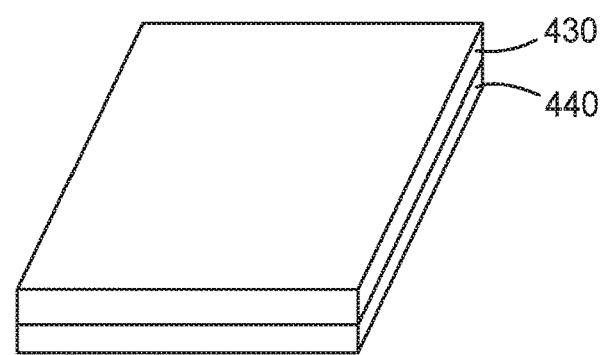
FIG. 4C is a top perspective view of a portion of another configuration of the display of FIG. 4A.

FIG. 4C is a top perspective view of a portion of another configuration of the display of FIG. 4A. Emissive display element 430 is disposed on reflector 440. Configured in the manner of FIG. 4A, emissive display element 430 should be at least partially transmissive so that the display can operate in a reflective mode. Similarly, emissive display element 430 may have a spatially varying transmissivity or varying in its transmitted wavelengths or group of wavelengths (providing, for example, a color filter over the surface of display 400).

FIG. 4D is a top perspective view of a portion of another configuration of the display of FIG. 4A. Emissive display element 430 is disposed on reflector 440. Each discrete portion of emissive display element 430 is disposed on a larger corresponding discrete portion of reflector 440 in a grid or array form. The relative coverage of the emissive display element 430 vis-à-vis reflector may be any suitable value, and may vary from grid element to grid element in periodic, non-periodic, or gradient manner. Emissive display element 430 may be partially transmissive, including having a spatially varying transmissivity. Although FIG. 4D suggests a square grid, any other arrangement or configuration may be suitable, including, for example, a hexagonally close-packed configuration.

FIG. 4D also provides a useful reference for the appearance of exemplary display mode configurations. For example, in a first mode, light may be selectively emitted from one or more of emissive display element 430. In some embodiments, the spacing of these emissive display elements may be such that a human eye cannot easily perceive the spacing between the elements. In another mode, light may not be emitted from the emissive display elements, but the light may be configured such that light is made to selectively reflect off of reflector 440 (and, in some embodiments, if emissive display element 430 is at least partially transmissive, the portion of reflector 440 covered by emissive display element 430 as well), thereby causing it to appear as if at least some of reflector 440 is illuminated (albeit through reflection and not emission). Any or all of the emissive display elements may have specific emission wavelengths ranges and the reflector portions may have color filter elements such that the display is capable of generating or displaying a desired color gamut. For example, the four emissive display elements in FIG. 4D and their associated reflector portions may be as an example, from top left continuing clockwise, red, green, blue, and green. In some embodiments, the arrangement may be red, green, blue, and white. These choices depend on the desired color gamut and applications and may be straightforwardly selected by the skilled person.

FIG. 5 is a schematic elevation cross-section of another display. Display 500 includes absorbing polarizer 510, compensator 520, diffuser layer 530, spatial light modulator 550, conductor layer 560a, electrode 560b, opposing conductor layer 540, reflecting element 580a, emissive display element 580b, and control devices 582a and 582b.

FIG. 5 illustrates generally an exemplary side-by-side configuration for the reflector (580a) and the emissive display element (580b) in display 500. Display 500 includes absorbing polarizer 510, corresponding to the absorbing polarizers 110, 210, 310, and 410 of FIGS. 1-4A, for example.

Compensator 520 may be any suitable material and any suitable thickness. For example, compensator 520 may be a weak retarder provided to compensate for the non-achromatic (i.e., wavelength sensitive) polarization rotation of the spatial light modulator. In some embodiments, compensator 520 may be a quarter wave or half wave retarder. Any suitable birefringent material, substrate, or combination of materials may be used, including liquid crystal materials or a stretched polymer film. Compensator 520 may be laminated to one or more adjacent layers, or it can be free floating in the stack of display 500.

Diffuser layer 530 may be any suitable diffusive layer, including both bulk (or volume) and surface scattering layers. Diffuser layer 530 may be useful for hiding defects or specular glare spots off of reflecting element 580a, for example. Diffuser layer 530 may be primarily or dominantly a forward scattering diffuser. In some embodiments, such a diffuser layer may be a roughened partial reflector. In some embodiments, the diffuser layer may be a polarization preserving diffuser (or a diffuser that does not substantially depolarize light). In some embodiments, the diffuser layer may have low backscattering and may not substantially depolarize light. In some embodiments, the diffuser layer may include one or more features to reduce sparkle in the display. For example, the diffuser layer may include graded-index particles or beads, a diffractive grating along one or more directions, or a combination of the two features. As FIG. 5 represents an exemplary configurations, other locations for the diffuser layer are contemplated: for example, diffuser layer 530 may additionally or alternatively be disposed on the front surface of display 500, on absorbing polarizer 510; or diffuser layer 530 may additionally or alternatively be disposed somewhere between reflecting element 580a and emissive element 580b and spatial light modulator 550.

Spatial light modulator 550 is any suitable spatial light modulator as described herein. In some embodiments, spatial light modulator 550 is a liquid crystal material. Spatial light modulator 550 may have a one or a plurality of pixels. In some embodiments, spatial light modulator 550 includes a color filter or color filter array. In some embodiments, spatial light modulator 550 includes an electrophoretic layer or layers, an electrochromic layer or layers, or an electrowetting layer or layers. As used herein, and unless indicated otherwise, liquid crystal module should be understood to not include one or more attached absorbing polarizers, as is sometimes used in the field.

Conductor layer 560a and opposing conductor layer 540 are configured to provide a voltage differential or other electric information to spatial light modulator 550 so that spatial light modulator 550 may switch between two or more states. Conductor layer 560a and opposing conductor layer 540 may any suitable transparent (overall transparent) or partially transparent conductor layer, including ITO, metal mesh, silver nanowire, or a combination of the preceding. The conductor layer and the opposing conductor layer may be the same or they may be different. Both of the conductor layers may have suitable addressable portions such that individual pixels may be controlled.

Electrode 560b may be any suitable electrode or electrode layer to allow for current to pass through emissive display element 580b (i.e., in electrical contact with emissive display element 580b). Electrode 560b may be a transparent (overall) or partially transparent layer, including metal mesh, silver nanowire, or any combination of the preceding. Electrode 560b may also be annular or similar; that is, electrode 560b may only trace the border or near the border of emissive display element 580b so a majority of the area of emissive display element 580b is not covered by electrode 560b. In this way, electrode 560b may be opaque but may not significantly affect the overall light output of emissive display element 580b.

Emissive display element 580b may be any suitable emissive display element. In some embodiments, emissive display element 580b may be an array of standard LEDs. In some embodiments, emissive display element 580b can include organic light emitting diodes (OLEDs). Emissive display element 580b may be monochromatic or it may include multiple color elements or subpixels. Emissive displays typically refer to displays that directly provide an image, in contrast with liquid crystal display type devices, which are illuminated by a uniform backlight and form an image through spatial light modulation or light gating. Emissive display element 580b may include extraction features on the OLED elements, including certain extraction features that minimize the appearance of sparkle.

Reflecting element 580a may be any suitable reflector, including reflective polished metals, metallized films, vapor deposited or coated films, or multilayer optical reflectors (such as ESR). Reflecting element may have any of the characteristics of other reflectors described herein. Reflecting element 580a may or may not be electrically conductive.

Control devices 582a and 582b may be any suitable transistor (including MOSFETs), switch, or other device useful for controlling current flow from a power source on the display through emissive display element 580b or through conductor layer 560a. The current flow may be controllable in a discrete (i.e., on or off) or continuous manner. In some embodiments, reflecting element 580a is a metalized or metal film or otherwise conducts electricity and so control device 582a may be electrically connected directly to the reflecting element, as depicted in FIG. 5. In some embodiments, however, reflecting element 580a is a non-conductive film stack and so control device 582a may be electrically connected instead to the conductor layer. In some embodiments where the reflecting element is conductive and also suitable for use as a conductor layer, conductor layer 560a may be omitted or combined with reflective element 580a. In some embodiments, where reflecting element 580a is not conductive so that conductor layer 560a is not omitted or combined with reflective element 580a, conductor layer 560a and electrode 560b may be combined into a single conductor layer or electrode.

Control devices 582a and 582b may be connected to any suitable electronic control mechanism, which may take input from a user's mode selection (i.e., high or low ambient light), sensors, a timer, or any combination thereof. These electronic and device design considerations may be different and tailored to the particular use mode or modes of the device.

Items described in this disclosure include:

Item 1 is a multi-mode display, comprising: an emissive display element; a partial reflector, disposed on the emissive display element; a spatial light modulator disposed on the partial reflector; and an absorbing polarizer disposed on the spatial light modulator.

Item 2 is the multi-mode display of item 1, wherein the partial reflector is a perforated reflector.

Item 3 is the multi-mode display of item 1, wherein the partial reflector has a spatially varying reflectivity.

Item 4 is the multi-mode display of item 1, wherein the partial reflector is a partial mirror.

Item 5 is the multi-mode display of item 1, wherein the partial reflector is a dichroic color filter.

Item 6 is the multi-mode display of item 5, wherein the dichroic color filter is an absorbing filter.

Item 7 is the multi-mode display of item 5, wherein the dichroic color filter is a reflecting filter.

Item 8 is the multi-mode display of item 1, wherein the spatial light modulator is a liquid crystal module.

Item 9 is the multi-mode display of item 1, wherein the partial reflector is a microstructured film.

Item 10 is the multi-mode display of item 1, wherein the partial reflector is a multilayer optical film.

Item 11 is the multi-mode display of item 1, further comprising a second absorbing polarizer, wherein the second absorbing polarizer is disposed between the emissive display element and the partial reflector.

Item 12 is the multi-mode display of item 1, wherein the partial reflector is a diffuser.

Item 13 is the multi-mode display of item 12, wherein the diffuser is a polarization preserving diffuser.

Item 14 is the multi-mode display of item 12, wherein the diffuser includes a diffractive grating.

Item 15 is the multi-mode display of item 12, wherein the diffuser includes graded-index particles.

Item 16 is the multi-mode display of item 12, wherein the diffuser includes a diffractive grating and graded-index particles.

Item 17 is the multi-mode display of item 12, wherein the diffuser is a forward scattering diffuser and a polarization preserving diffuser.

Item 18 is the multi-mode display of item 1, wherein the partial reflector includes a roughened surface.

Item 19 is the multi-mode display of item 1, wherein the emissive display element includes organic light emitting diodes.

Item 20 is the multi-mode display of item 1, wherein the multi-mode display is capable of operating in a first mode and a second mode, wherein in the first mode the multi-mode display operates primarily as a reflective display and in the second mode the multi-mode display operates primarily as an emissive display.

Item 21 is the multi-mode display of item 20, wherein the multi-mode display is further capable of operating in a third mode, wherein in the third mode the multi-mode display operates primarily as a reflective display and the light emitting element is illuminated.

Item 22 is a multi-mode display, comprising: a backlight including a first liquid crystal module and at least one absorbing polarizer; a partial reflector, disposed on the backlight; a second liquid crystal module disposed on the partial reflector; and an absorbing polarizer disposed on the second liquid crystal module.

Item 23 is a multi-mode display, comprising: a emissive display element patterned on a reflector; a liquid crystal module disposed on the emissive display element; an absorbing polarizer disposed on the liquid crystal module.

Item 24 is a multi-mode display, comprising: a reflector; a partially transparent emissive display element disposed on the reflector; a liquid crystal module disposed on the partially transparent emissive display element; an absorbing polarizer disposed on the liquid crystal module.

Item 25 is a multi-mode display, comprising: an emissive display; a reflective display including a reflector, the emissive display backlighting the reflective display; wherein the reflector of the reflective display is partially transmissive.

Item 26 is the multi-mode display of item 25, wherein the reflector of the reflective display transmits at least 10% of light of all polarizations at normal incidence.

Item 27 is the multi-mode display of item 25, wherein the reflective display includes an electrowetting display.

Item 28 is the multi-mode display of item 25, wherein the reflective display includes a liquid crystal display.

Item 29 is the multi-mode display of item 25, wherein the reflective display includes an electrophoretic display.

Item 30 is the multi-mode display of item 25, wherein the reflective display includes an electrochromic display.

Descriptions for elements in figures should be understood to apply equally to corresponding elements in other figures, unless indicated otherwise. The present invention should not be considered limited to the particular examples and embodiments described above, as such embodiments are described in detail in order to facilitate explanation of various aspects of the invention. Rather, the present invention should be understood to cover all aspects of the invention, including various modifications, equivalent processes, and alternative devices falling within the scope of the invention as defined by the appended claims and their equivalents.

What is claimed is:

1. A multi-mode display, comprising:
   an emissive display element comprising multiple pixel elements and configured to directly provide an image;
   a partial reflector, disposed on the emissive display element;
   a spatial light modulator disposed on the partial reflector; and
   an absorbing polarizer disposed on the spatial light modulator;
   wherein in a mode where the multi-mode display operates as a reflective display, to provide maximum reflection, the spatial light modulator is configured such that light is not rotated after passing through the absorbing polarizer, and to provide minimum reflection, the spatial light modulator is configured so that light is rotated after passing through the absorbing polarizer.

2. The multi-mode display of claim 1, wherein the partial reflector has a spatially varying reflectivity.

3. The multi-mode display of claim 1, wherein the partial reflector is a partial mirror.

4. The multi-mode display of claim 1, wherein the partial reflector is a dichroic color filter.

5. The multi-mode display of claim 4, wherein the dichroic color filter is an absorbing filter.

6. The multi-mode display of claim 4, wherein the dichroic color filter is a reflecting filter.

7. The multi-mode display of claim 1, wherein the spatial light modulator is a liquid crystal module.

8. The multi-mode display of claim 1, wherein the partial reflector is a microstructured film.

9. The multi-mode display of claim 1, wherein the partial reflector is a multilayer optical film.

10. The multi-mode display of claim 1, wherein the partial reflector is a diffuser.

11. The multi-mode display of claim 1, wherein the multi-mode display is capable of operating in a first mode and a second mode, wherein in the first mode the multi-mode display operates primarily as a reflective display wherein at least a portion of the light passing through the first absorbing polarizer is reflected by the partial reflector and passed back through the first absorbing polarizer to create a displayed image, and in the second mode the multi-mode display operates primarily as an emissive display.

* * * * *